United States Patent
Pascucci

[19]

[11] Patent Number: 5,901,087
[45] Date of Patent: May 4, 1999

[54] GAIN MODULATED SENSE AMPLIFIER

[75] Inventor: Luigi Pascucci, Sesto San Giovanni, Italy

[73] Assignee: SGS--Thmomson Microelectronics S.r.l., Agrate Brianza, Italy

[21] Appl. No.: 08/828,790

[22] Filed: Mar. 27, 1997

[30] Foreign Application Priority Data

Mar. 29, 1996 [EP] European Pat. Off. ............. 96830164

[51] Int. Cl.$^6$ ................................................. G11C 16/06
[52] U.S. Cl. .................. 365/185.21; 365/185.25; 365/205; 365/208; 365/210; 365/202; 327/52; 327/55; 327/56; 327/57
[58] Field of Search ................................... 365/205, 208, 365/210, 190, 196, 202, 203, 185.21, 185.25; 327/52, 55, 56, 57

[56] References Cited

U.S. PATENT DOCUMENTS

| 4,719,602 | 1/1988 | Hag et al. | 365/189.05 |
| 5,029,136 | 7/1991 | Tran et al. | 365/205 |
| 5,491,434 | 2/1996 | Harnishfeger et al. | 327/50 |
| 5,668,765 | 9/1997 | Ang | 365/205 |
| 5,694,363 | 12/1997 | Calligaro et al. | 365/190 |

FOREIGN PATENT DOCUMENTS

| A-0 143 591 | 6/1985 | European Pat. Off. | G11C 7/00 |
| A-0 205 294 | 12/1986 | European Pat. Off. | G11C 11/24 |

OTHER PUBLICATIONS

European Search Report from European Patent Application No. 96830164.8, filed Mar. 29, 1996.

Primary Examiner—David Nelms
Assistant Examiner—Andrew Q. Tran
Attorney, Agent, or Firm—Wolf, Greenfield & Sacks, P.C.

[57] ABSTRACT

A gain modulated sense amplifier, particularly for memory devices, that comprises a virtual ground latch structure which has two output nodes and which includes equalization transistor of a first polarity which equalizes the two output nodes and is connected between a first branch and a second branch, in which the output nodes are arranged; the equalization transistor is driven by an equalization signal whose slope can be modulated as a function of conductivity of a memory cell of the memory device.

8 Claims, 3 Drawing Sheets

5,901,087

GAIN MODULATED SENSE AMPLIFIER

BACKGROUND OF THE INVENTION

1. Field of the Invention

The present invention relates to a gain modulated sense amplifier, particularly for memory devices.

2. Discussion of the Related Art

It is known that in a memory device the sense amplifier is the circuital element that is meant to sense the data in the memory matrix and then capture the data when the correct reading values are reached.

In dynamic sense amplifiers, characterized by latch memory structures, it is very important to determine the moment of data sensing and the sensitivity of the amplifier, i.e., the timing of the control step used for data capture, so as to obtain the best possible result in any operating condition.

The sensing step generally occurs after a first precharging step that very quickly brings the various bit lines, to which the various memory cells are connected, to the operating level and equalizes them. Indeed because they are equalized, these lines must have adequate time to assume a difference, however small, that allows certain and correct data reading.

However, the time intervals that determine a timing for reading a non-volatile memory are not absolute and depend on a certain number of variables, such as: the conductivity characteristics of the memory cells; the levels transmitted to the cells at the given instant; the capacitance of the associated lines; the minimum sensitivity of the sense amplifiers; the impedances of the memory access paths; the presence/absence of supply voltage boosting circuits; the operating temperature.

It is therefore evident that it is not possible to establish beforehand a given data sensing timing, with the purpose of optimizing the read times of a memory device.

Even if timing of the sensing step is considerably expanded, consequently slowing data capture, the case may occur in which the voltage levels transmitted to the cells are still insufficient to determine their conductivity. If the reading operation was executed during this case, the result of the reading operation would be unreliable.

A memory device with cells which are scarcely conductive requires a longer settling time than a similar device with cells which are more conductive. In any case, the sensing step must be followed by a data capture step that must be performed as quickly as possible.

What is needed, therefore, is a device which modulates the data sensing timing which allows the device to adapt the data reading times to the actual conductivity of a memory cell in the various operating conditions.

SUMMARY OF THE INVENTION

Therefore, one aim of the present invention is therefore to provide a sense amplifier, particularly for memory devices, whose data capture sensitivity can be modulated.

Within the scope of this aim, an object of the present invention is to provide a sense amplifier that has a digital data capture characteristic.

Another object of the present invention is to provide a sense amplifier whose consumption is restricted exclusively to the data read interval.

Another object of the present invention is to provide a sense amplifier that has a reversibility characteristic, so that it is possible to swap the matrix side of the sense amplifier with the reference side of the sense amplifier and vice versa.

Another object of the present invention is to provide a sense amplifier that has intrinsic speed characteristics.

Another object of the present invention is to provide a sense amplifier that can be used in reference systems to determine the status of a memory cell.

Significantly, the present invention provides a sense amplifier that is highly reliable and relatively easy to manufacture at competitive costs.

This aim, these objects, and others that will become apparent hereinafter are achieved by a gain modulated sense amplifier, particularly for memory devices, that comprises a virtual ground latch structure that has two output nodes, comprising an equalization transistor of a first polarity that is adapted to equalize said two output nodes and is connected between a first branch and a second branch, in which the output nodes are arranged, the equalization transistor being driven by an equalization signal whose slope can be modulated as a function of the conductivity of a memory cell of the memory device involved in the reading operation.

BRIEF DESCRIPTION OF THE DRAWINGS

Further characteristics and advantages of the invention will become apparent from the description of a preferred but not exclusive embodiment of the sense amplifier according to the invention, illustrated only by way of non-limitative example in the accompanying drawings, wherein.

DETAILED DESCRIPTION

Figure 1:
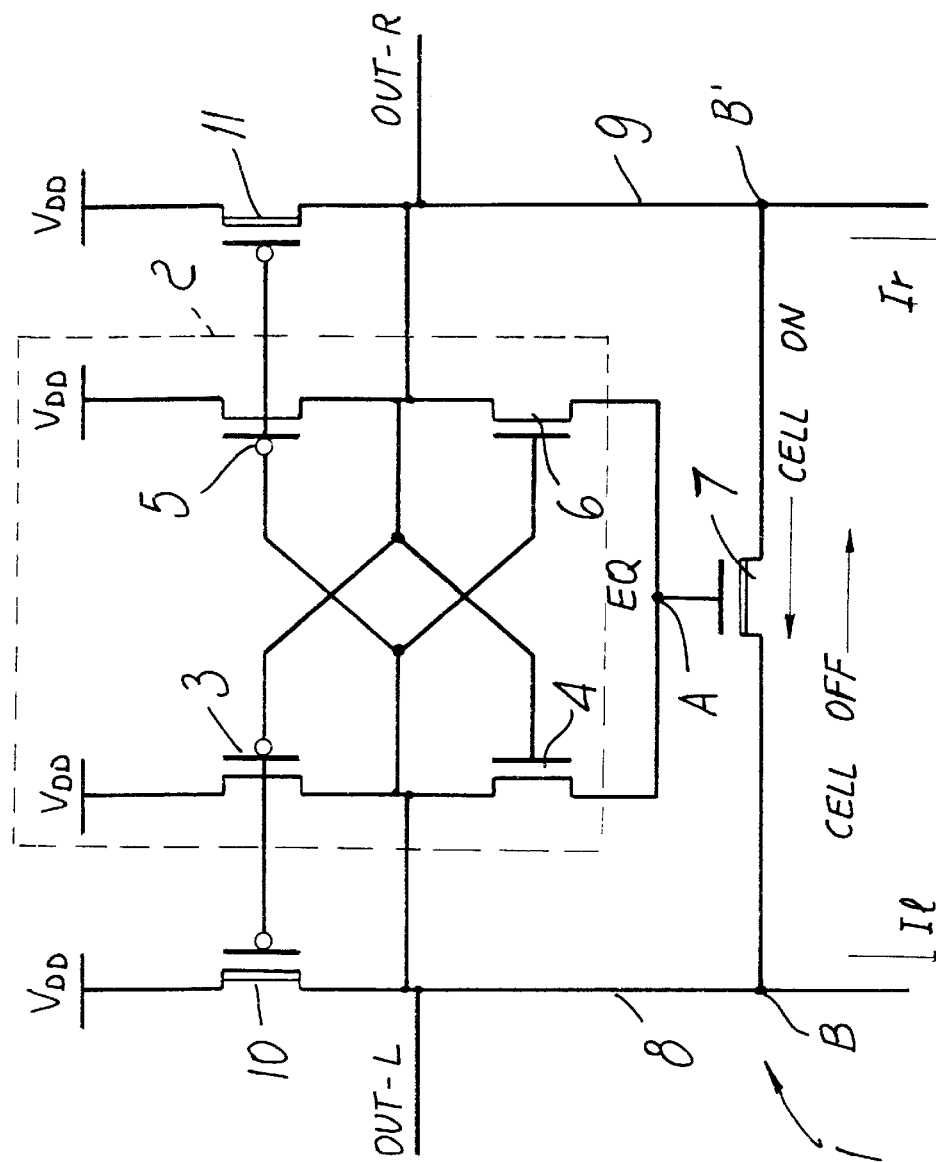
FIG. 1 is a circuit diagram of the sense amplifier according to the invention.

With reference to FIG. 1, the sense amplifier according to the invention, generally designated by the reference numeral 1, comprises a virtual ground latch structure 2 that is constituted by two pairs of transistors of the P-channel and N-channel type, respectively.

In particular, the latch structure 1 comprises a first P-channel transistor 3, a second N-channel transistor 4, a third P-channel transistor 5, and a fourth N-channel transistor 6.

The source terminal of the transistor 3 is connected to the supply voltage $V_{DD}$, its drain terminal is connected to the drain terminal of the transistor 4, and its gate terminal is connected to the output node OUT-R.

The gate terminal of the transistor 4 is also connected to the output node OUT-R.

The source terminal of the transistor 5 is connected to the supply voltage $V_{DD}$, its drain terminal is connected to the drain terminal of the transistor 6, and its gate terminal is connected, together with the gate terminal of the transistor 6, to the output node OUT-R.

The output nodes OUT-L and OUT-R are located respectively on the connections between the drain terminals of the transistors 3–4 and 5–6.

The source terminals of the transistors 4 and 6 are common-connected to the gate terminal of a fifth equalization transistor 7, which is advantageously of the native N-channel low-threshold type. An equalization signal is sent to the gate terminal of the transistor 7 and thus to the node A. The signal is appropriately slope modulated as a function of the conductivity of the memory cell involved in the reading operation.

The equalization transistor 7 is interposed between a first node B and a second node B' that are arranged respectively on a first branch and on a second branch, referenced respectively as left branch 8 and right branch 9.

The left branch 8 comprises an additional sixth P-channel precharge transistor 10 of the native high-threshold type, in which the source terminal is connected to the supply voltage $V_{DD}$, the drain terminal is connected to the output node OUT-L, and the gate terminal is connected to the gate terminal of the transistor 3.

Likewise, the right branch 9 comprises an additional seventh P-channel precharge transistor 11 of the native high-threshold type, in which the source terminal is connected to the supply voltage $V_{DD}$, the drain terminal is connected to the output node OUT-R, and the gate terminal is connected to the gate terminal of the transistor 5.

The precharge transistors 10 and 11 are preferably identical to each other.

Figure 2:
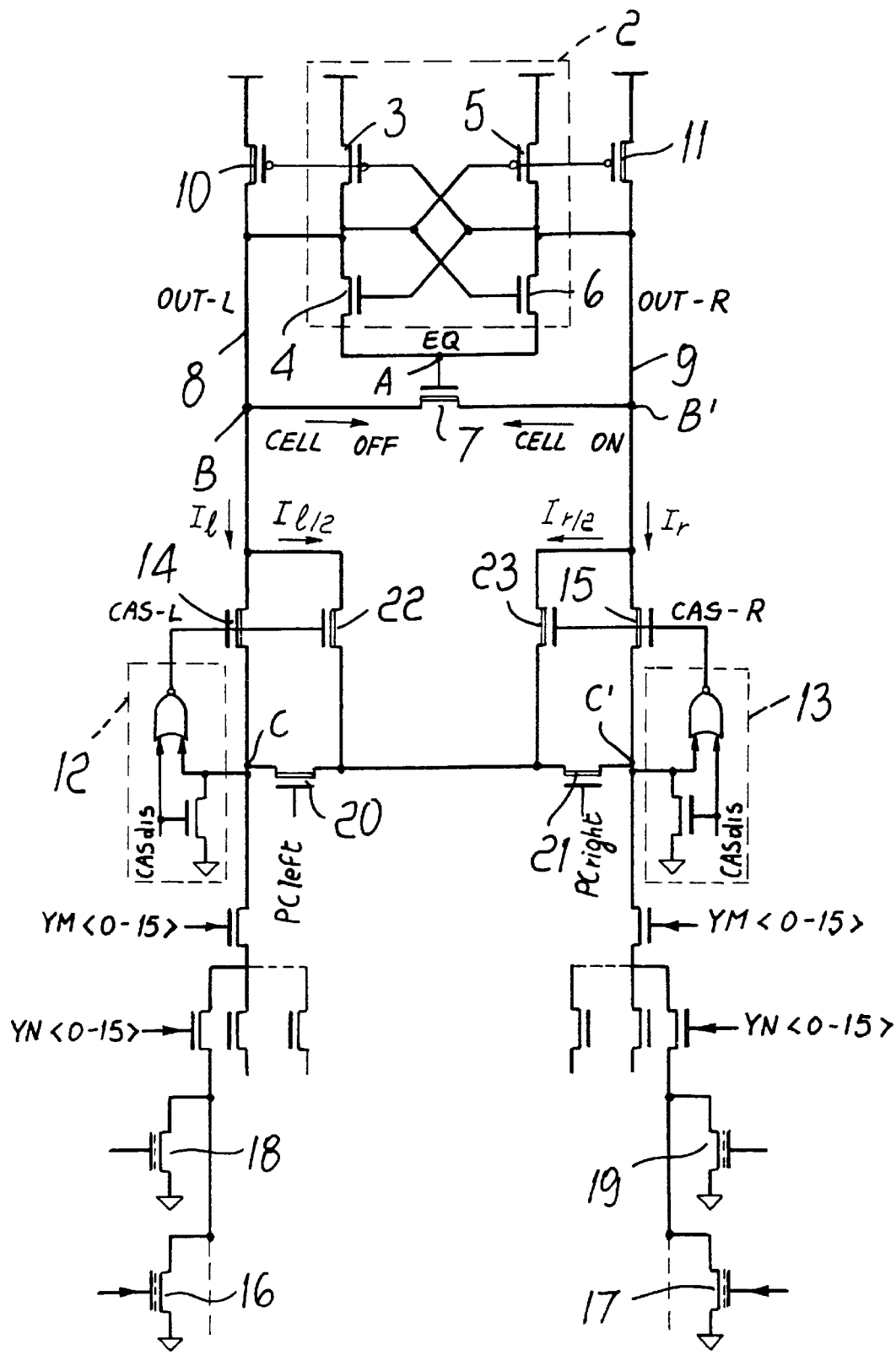
FIG. 2 is a circuit diagram of a possible use of the sense amplifier of FIG. 1 in a reference system for determining the state of a memory cell.

FIG. 2 illustrates the use of the sense amplifier according to the invention in a system which, by performing appropriate changes to the current flows, allows the production of the necessary reference voltage that is adapted to allow the status of a memory cell to be read-determinable, i.e., to determine its programmed or unprogrammed condition on the basis of an appropriate current imbalance at the loads to sense the conductivity of a memory cell and consequently classify it as programmed or unprogrammed.

The characteristics of said reference system are described in a copending patent application in the name of the same Applicant.

The circuit shown in FIG. 2 therefore comprises, in addition to the circuit shown in FIG. 1, a matrix of memory cells 16 that is connected to the left branch 8, a memory cell matrix 17 that is connected to the right branch 9, a plurality of reference cells 18 and 19 arranged respectively in the half-plane of the left and right memory matrix, and selection means, which are characterized by two buses YM and YN for the left branch 8 and for the right branch 9.

The selection circuit provides the ability to select a memory cell from the memory cell matrix.

Two pass enabling transistors for connection between the loads and the memory cells, one designated by 14 for the left branch 18 and one designated by 15 for the right branch 9, allow connection between the loads and the memory cells.

Two biasing structures 12 and 13, one for each branch, ensure the biasing of the transistors 14 and 15 and therefore the connection of the loads to the memory cells.

The reference system also includes, for each branch, an equalization transistor, designated by 20 (for the left branch 9) and 21 (for the right branch 8), which are driven respectively by a precharge signal PCleft and by a precharge signal PCright. Said transistors 20 and 21 are adapted to equalize the nodes C and C" of the two branches 8 and 9.

Additional transistors 22 and 23 are respectively parallel-connected to the transistors 14 and 15.

The size of the transistors 14 and 15 is twice that of the transistors 22 and 23, so as to produce a redistribution of the currents of the loads on the branches 8 and 9 with a 2:1 ratio.

Figure 3:
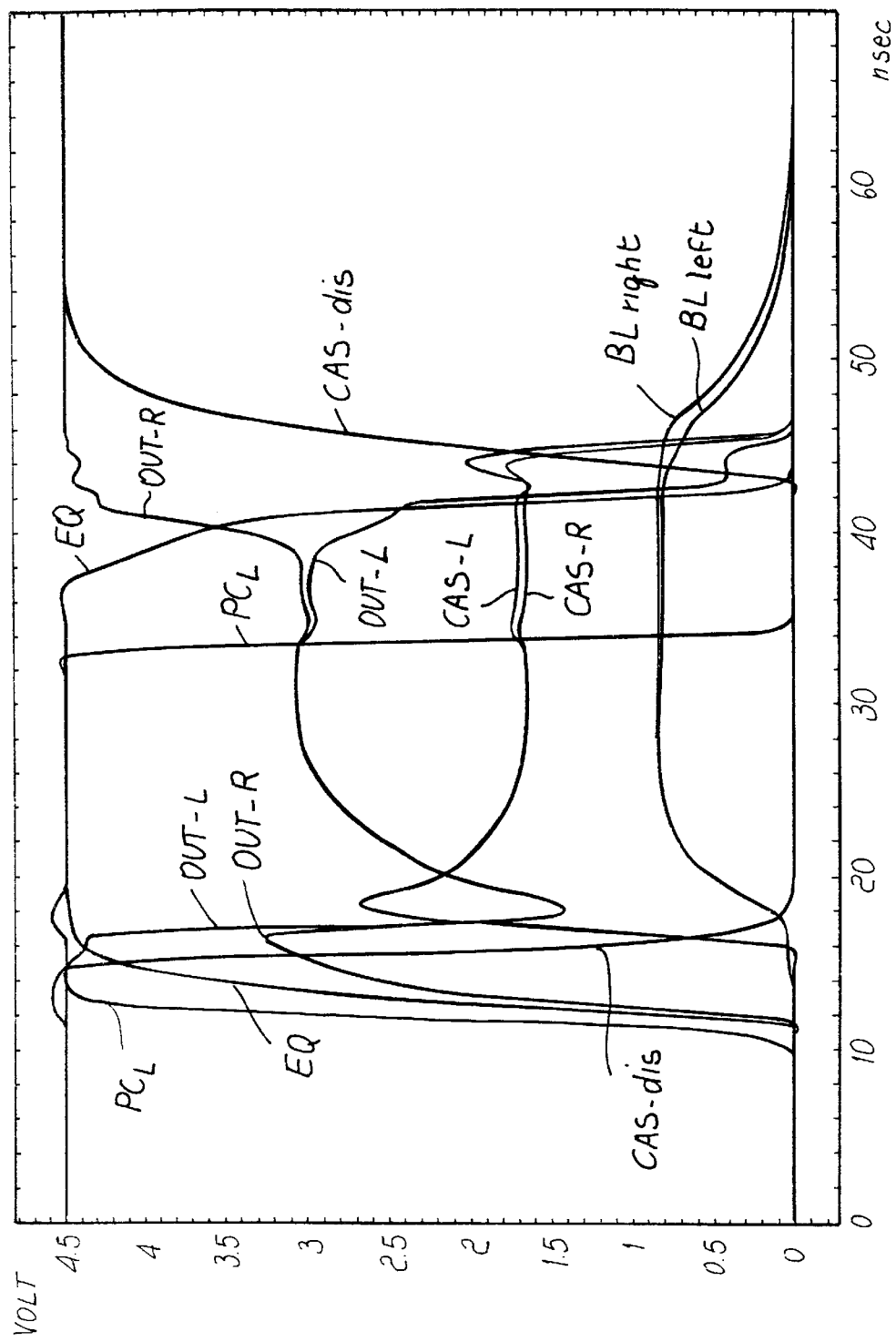
FIG. 3 is a chart of the timings of the various signals that are present in the circuit diagram of FIG. 2, in which the sense amplifier according to the invention is used.

FIG. 3 plots the signals that are present in the circuit of FIG. 2 and will be explained in detail with reference to the operation of the sense amplifier according to the invention.

With reference to FIG. 1, the operation of the sense amplifier according to the invention is as follows.

Initially, during the inactive step, the signal EQ is at the ground value. In these conditions, the two output nodes OUT-L and OUT-R are in an opposite logic state, i.e., 1-0 or 0-1.

A normal cycle for reading a memory device consists of a first precharging step and of a second sensing step: both steps are performed while the signal EQ is at the logic level "1".

The precharging step starts with the transition from 0 to 1 of the signal EQ and is performed by the transistors 10 and 11 in parallel, respectively, to the transistors 3 and 5. In view of the geometries (greater size of the transistors 10 and 11 with respect to the transistors 3 and 5), the component provided by the precharge transistors 10 and 11 is greater than the component provided by the transistors 3 and 5.

Precharging is completed when the operating point is reached by the two output nodes OUT-L and OUT-R.

The operating point is set so that the voltage level of the output nodes OUT-L and OUT-R prevents conduction of the transistors 10 and 11, which being of the native P-channel type, have a higher threshold (threshold voltage $=-1.7$ V) than the corresponding parallel-connected transistors 3 and 5 (threshold voltage $=-0.9$ V).

During the precharging step and throughout the period during which the signal EQ remains high the nodes OUT-L and OUT-R are equalized by means of the equalization transistor 7. The currents Il and Ir are also identical.

At the end of the precharging step, a difference between the currents Il and Ir is produced, with the consequent formation of a current vector Icell across the equalization transistor 7. The current vector is equal to the difference of the currents on the two output nodes OUT-L and OUT-R.

The current vector presets a potential voltage drop across the transistor 7 as soon as its conductivity decreases.

The transistors 4 and 6 of the latch structure 2 insulate the node A with respect to the output nodes OUT-L and OUT-R when said node is at the logic level "1", i.e., when EQ is high.

Once the equilibrium condition has been reached, and only after reaching it, the sensing step can occur; the sensing step is performed with the transition of the signal EQ from 1 to 0.

Indeed, when EQ becomes low, the step for the equalization of the two output nodes OUT-L and OUT-R is terminated, and at the same time, the latch structure 2 is activated by connecting the node A to the ground.

The output nodes OUT-L and OUT-R diverge quickly from the common operating point as a function of the currents that are present on the output nodes at the moment of sensing.

More specifically, if Il designates the current vector that is present on the left branch 8 and Ir designates the current vector that is present on the right branch 9, one has:

if: Il>Ir→OUT-L=0 OUT-R=$V_{DD}$
Il<Ir→OUT-L=$V_{DD}$ OUT-R=0

It should be noted that the equalization transistor 7 is of the native N-channel type (with a threshold voltage equal to 0.4 V) and the operating point is set to:

($V_{DD}$−0.9−0.6)=($V_{DD}$−1.5 V)

This configuration allows to conveniently control the sensing step.

It is sufficient to modulate the slope of the signal EQ to drive the rate of divergence of the two output nodes OUT-L and OUT-R; this divergence is produced by virtue of the action of the current vector that affects the equalization transistor 7.

In particular, if the slope of the equalization signal is steep, a quick separation of the two nodes occurs. A steep slope of the equalization signal indicates high conductivity of the memory cell involved in the reading operation and therefore the possibility of performing data capture quickly.

Conversely, gentle slope of the equalization signal entails a slow separation of the two output odes OUT-L and OUT-R.

This characteristic can be used advantageously to manage in the most convenient manner the various conditions in which the data are read from the memory.

The availability of information related to the currents that are present in the system allows to link to said information the slope of the equalization signal EQ that controls the timing of the sensing step.

A circuit for generating a signal whose slope can be modulated as a function of the conductivity of a memory cell is described in EPA no. 95830336.4 in the name of the same Applicant, which is assumed included herein by reference.

If the currents of the system are high, it is possible to perform data reading with a steeper slope of the signal EQ (providing faster reading), since strong signals are present in the sense amplifier as well.

Conversely, if the currents in the system are weak, reading is performed more slowly, increasing the slope of the signal EQ, which entails a longer read time. However, since weak signals are present, this is necessary in order to achieve correct data reading; in this manner, the sensitivity of the sense amplifier is modulated.

The current vector that flows across the equalization transistor 7 is directed from the right branch 9 toward the left branch 8 if the memory cell is unprogrammed. Otherwise if the cell is programmed, the direction of the current vector that flows from the left branch 8 to the right branch 9.

FIG. 2 is a view of the use of the sense amplifier according to the invention in a reference system in which an imbalance is produced, with a gain of current at the loads; the current vector that flows across the equalization transistor 7 is equal to the difference between the currents that are present on the two branches 8 and 9.

The reference system operates as follows.

Assuming that one has to read the memory cell 16, at the end of the precharging step the signal PCleft, which is initially high like the signal PC right, is brought to the ground value.

In this manner, an imbalance is produced in the current paths toward the branch that is now taken as reference (the right branch of the cell 17), so that half of the current of the left branch is rerouted toward the right branch, i.e., the reference. In this manner, if the cell 16 is conductive (unprogrammed), its current is provided only by the transistor 14 and a value Il/2 is rerouted onto the left branch by mirroring. As a consequence of this imbalance, the transistor 5 has to supply, by means of the transistor 7, the current vector Il/2 drawn by the transistor 22.

In this way, the node OUT-R acquires a potential tendency to increase in level, whereas the opposite occurs for OUT-L.

These tendencies have no effect while equalization persists. The gradual drop of the signal EQ then allows safe separation of the two nodes OUT-L and OUT-R.

If instead the cell 16 is not conductive (programmed), the current across the transistor 14 is zero, and the current across the transistor 22 is also approximately zero.

The current on the reference branch arrives entirely from the node OUT-R. The transistor 5 contributes to this current twice as much as the transistor 3.

Accordingly, the node OUT-L acquires a potential tendency to reach the power supply value, whereas OUT-R acquires a potential tendency to decrease to the ground value.

The structure is reversible and therefore the above description also applies symmetrically for the is cell 17 on the right branch.

The cascode structures 12 and 13 ensure connection between the loads and the memory cells.

Said cascode structures are described in EPA no. 95830357 in the name of the same Applicant, which is assumed included herein as reference.

FIG. 3 is a chart of the timing of the signals that are present in the circuit of FIG. 2; said signals also apply to the circuit of FIG. 1.

The switching of the signal EQ with a slope that is a function of the conductivity of the memory cell involved in the reading operation therefore causes the faster or slower divergence of the two output nodes OUT-L and OUT-R.

Capture of the data item by the sense amplifier occurs only after a certain difference at the output nodes has been produced and is sufficient to prevent corruption of the data due to Miller effects that occur in the system.

In the chart, the signals PCleft and PC right are the precharge signals that are sent to the gate terminals of the transistors 20 and 21 respectively. The signals, in a reference system as shown in FIG. 2, allow to swap the reference branch and the matrix branch and vice versa, i.e., to swap the reference and the matrix according to the memory half-matrix in which reading must be performed.

Therefore, if reading is performed in the left half-matrix, the reference is taken in the half-plane of the right matrix, and vice versa.

The signals CAS-L and CAS-R are the signals for biasing the transistors 14, 22, 15, and 23.

The signal CAS-dis is the signal for disabling/enabling the cascode structures 12 and 13.

Finally, the curves BLright and BLleft plot the bit lines to which the memory cells involved in the reading operation are connected.

In practice it has been observed that the sense amplifier according to the invention fully achieves the intended aim, since it allows to provide data capture with a sensitivity that can be modulated as a function of the conductivity of the memory cell involved in the reading operation. The equalization signal EQ sent to the node A of the sense amplifier has a slope that can be modulated as a function of the conductivity of the memory cell involved in the reading operation.

The divergence of the two output nodes OUT-L and OUT-R becomes faster as the slope with which the equalization signal EQ switches from high to low becomes steeper.

Capture of the data item by the sense amplifier occurs only after an imbalance that is sufficient to ensure correct reading has occurred at the output nodes.

Modulation of the sensitivity of the sense amplifier is therefore provided as a function of the conductivity of the memory cell.

The sense amplifier thus conceived is susceptible of numerous modifications and variations, all of which are within the scope of the inventive concept.

Thus, for example, the transistor 7, shown in FIGS. 1 and 2 as a native N-channel type transistor, can be replaced with an Light Voltage Shift (LVS) type transistor.

In FIG. 2, the reference system to which the sense amplifier according to the invention is applied can be different from the one shown in FIG. 2 without altering the use of the amplifier according to the invention. For example, the memory matrix cell may not be split into two half-matrices and therefore it is no longer necessary to have two reference lines, one for each half-plane.

Therefore, the reference can be constituted by a single memory cell.

The case shown by way of example in FIG. 2 relates to line referencing; the sense amplifier according to the invention can also be used in a reference system that uses column referencing.

The biasing structures, which are shown by way of example as dynamic cascode structures, can be replaced with fixed biases.

The 2:1 mirroring ratio provided by means of the reference system according to the invention can be modified, by adding transistors in parallel to the transistors 22 and 23, into a different mirroring ratio, for example 3:1 etcetera, without altering the functionality of the sense amplifier according to the invention.

Finally, all the details may be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Gain modulated sense amplifier, particularly for a memory device, comprising a virtual ground latch structure having two output nodes, the virtual ground latch structure including an equalization transistor of a first polarity which equalizes said two output nodes and is connected between a first branch and a second branch, in which said output nodes are arranged, said equalization transistor being driven by an equalization signal whose slope is modulated as a function of conductivity of a memory cell of said memory device.

2. The gain modulated sense amplifier according to claim 1, further comprising, for each one of said branches, a precharge transistor of a second polarity that is connected between the supply voltage and said output node, the gate terminal of the precharge transistor of the first branch being connected to the output node of said second branch, said precharge transistors being adapted to precharge said output nodes to reach an operating point.

3. The gain modulated sense amplifier according to claim 1, wherein said virtual ground latch structure comprises a first pair of transistors and a second pair of transistors, said first pair of transistors including said transistor of a first polarity and a transistor of a second polarity, said second pair of transistors including a second transistor of said first polarity and a second transistor of said second polarity, the gate terminals of the transistors of said first pair being connected to the output node of said second branch and the gate terminals of the transistors of said second pair being connected to the output node of said first branch.

4. The gain modulated sense amplifier according to claim 2, wherein said precharge transistors of said second polarity are native transistors.

5. The gain modulated sense amplifier according to claim 1, wherein said equalization transistor of said first polarity is a native transistor.

6. The gain modulated sense amplifier according to claim 1, wherein said equalization transistor of said first polarity is a light voltage shift (LVS) transistor.

7. The gain modulated sense amplifier according to claim 3, wherein said transistors of said first polarity are N-channel transistors and said transistors of said second polarity are P-channel transistors.

8. The gain modulated sense amplifier according to claim 1, wherein said sense amplifier is used in an imbalance reference system with current gain at the loads, to determine the programmed/nonprogrammed status of a memory cell, said equalization transistor being crossed by a current that is equal to the difference between the currents that are present on the branches of said reference system.

* * * * *